(12) United States Patent
Polivka

(10) Patent No.: US 12,411,157 B2
(45) Date of Patent: Sep. 9, 2025

(54) MAGNETIC SATURATION DETECTOR WITH SINGLE AND MULTIPLE TRANSVERSE WINDINGS

(71) Applicant: POWER INTEGRATIONS, INC., San Jose, CA (US)

(72) Inventor: William M. Polivka, Campbell, CA (US)

(73) Assignee: POWER INTEGRATIONS, INC., San Jose, CA (US)

( * ) Notice: Subject to any disclaimer, the term of this patent is extended or adjusted under 35 U.S.C. 154(b) by 764 days.

(21) Appl. No.: 17/619,903

(22) PCT Filed: Aug. 17, 2020

(86) PCT No.: PCT/US2020/046612
§ 371 (c)(1),
(2) Date: Dec. 16, 2021

(87) PCT Pub. No.: WO2021/034743
PCT Pub. Date: Feb. 25, 2021

(65) Prior Publication Data
US 2022/0308094 A1  Sep. 29, 2022

Related U.S. Application Data

(60) Provisional application No. 62/887,810, filed on Aug. 16, 2019.

(51) Int. Cl.
*H02M 1/32* (2007.01)
*G01R 15/18* (2006.01)
*H02M 3/24* (2006.01)

(52) U.S. Cl.
CPC ............ *G01R 15/186* (2013.01); *H02M 1/32* (2013.01); *H02M 3/24* (2013.01)

(58) Field of Classification Search
CPC ............ H02M 3/22; H02M 1/08; H02M 1/36; H02M 3/24; H02M 3/325; H02M 3/335;
(Continued)

(56) References Cited

U.S. PATENT DOCUMENTS 3,226,639 A    12/1965  Will
3,403,323 A *   9/1968  Wanlass .................. H01F 29/14
                                                      336/215
(Continued)

FOREIGN PATENT DOCUMENTS

CN    1154721 A    7/1997
CN    2453528 Y   10/2001
(Continued)

OTHER PUBLICATIONS

U.S. Appl. No. 17/620,057, Non-Final Office Action mailed Nov. 13, 2024; 18 pages.
(Continued)

*Primary Examiner* — Sean Kayes
*Assistant Examiner* — Nusrat Quddus

(57) ABSTRACT

Magnetic saturation detectors for power converters are presented herein. An energy transfer element has an input power winding wrapped around a center post. Single or multiple transverse windings are positioned perpendicular to the input power winding and coupled to receive a transverse current that provides a transverse magnetic flux density within the energy transfer element. The transverse magnetic flux density produces a transverse voltage waveform. A voltage detection circuit is configured to receive the transverse voltage waveform and detect a change in the sign of the slope of the transverse voltage waveform. The change in the sign of the slope indicates magnetic saturation. The voltage detection circuit is configured to detect an occur-
(Continued)

rence of an extremum in the transverse voltage waveform. The extremum indicates the change in the sign of the slope.

20 Claims, 10 Drawing Sheets

(58) Field of Classification Search
CPC ............... H02M 3/28; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 3/1582; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/32; H02M 2001/322; H02M 2001/327; H02M 1/34; H02M 2001/342; H02M 2001/344; H02M 2001/346; H02M 2001/348; H02M 1/38; H02M 1/42; H02M 1/4208; H02M 1/4216; H02M 1/4225; H02M 1/4233; H02M 1/4241; H02M 1/425; H02M 1/4258; H02M 1/4266; H02M 2001/4275; H02M 2001/4283; Y02B 70/1491; H02J 3/46; H02J 3/38; H02J 3/1878; H01F 29/00; H01F 29/02; H01F 29/025; H01F 29/04; G05F 1/10; G05F 1/12; G05F 1/14; G05F 1/147; G05F 1/153; G05F 1/16; G05F 1/20; G05F 1/22; G05F 1/24; G05F 1/247; G05F 1/253; G05F 1/26; G05F 1/30; H01H 9/0005; H02H 7/055; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17; G01R 33/02
See application file for complete search history.

(56) References Cited

U.S. PATENT DOCUMENTS

| | | | |
|---|---|---|---|
| 3,739,257 A * | 6/1973 | Hunter | G05F 1/13 323/248 |
| 4,020,440 A | 4/1977 | Moerman | |
| 4,103,221 A | 7/1978 | Fukui et al. | |
| 4,206,434 A | 6/1980 | Hase | |
| 4,277,751 A * | 7/1981 | Lawson | G01R 33/045 324/254 |
| 4,295,838 A * | 10/1981 | Richards | B31D 1/005 493/134 |
| 4,307,334 A | 12/1981 | Peil et al. | |
| 4,439,822 A | 3/1984 | Cocconi | |
| 4,459,653 A | 7/1984 | Smith | |
| 4,583,156 A | 4/1986 | Forge | |
| 4,791,542 A * | 12/1988 | Piaskowski | H02M 7/53832 363/75 |
| 4,853,668 A * | 8/1989 | Bloom | H01F 27/255 336/170 |
| 4,994,952 A * | 2/1991 | Silva | H01F 29/14 174/DIG. 17 |
| 5,166,597 A * | 11/1992 | Larsen | G05F 1/20 323/215 |
| 5,317,300 A | 5/1994 | Boesel | |
| 5,440,225 A | 8/1995 | Kojima | |
| 5,446,346 A * | 8/1995 | Nilssen | H05B 41/245 315/219 |
| 5,534,837 A | 7/1996 | Brandt | |
| 5,737,203 A * | 4/1998 | Barrett | H02M 3/33561 363/75 |
| 5,757,184 A * | 5/1998 | Kurihara | G01R 33/02 324/258 |
| 6,194,897 B1 * | 2/2001 | Fukunaga | G01R 33/04 324/253 |
| 6,208,531 B1 | 3/2001 | Vinciarelli et al. | |
| 6,370,043 B1 * | 4/2002 | Yasumura | H02M 7/217 363/21.02 |
| 6,380,735 B1 * | 4/2002 | Kawakami | G01R 33/04 324/253 |
| 6,490,180 B2 * | 12/2002 | Hiltunen | H01F 30/10 363/21.16 |
| 6,639,499 B2 | 10/2003 | Okita et al. | |
| 7,646,281 B2 | 1/2010 | Diekmann et al. | |
| 8,253,299 B1 * | 8/2012 | Rittenhouse | B62M 6/90 310/257 |
| 8,610,533 B2 | 12/2013 | Nussbaum | |
| 2003/0020428 A1 * | 1/2003 | Masaki | H02P 6/18 318/727 |
| 2003/0052671 A1 * | 3/2003 | Kawase | G01C 17/30 324/249 |
| 2009/0230776 A1 | 9/2009 | Ochi et al. | |
| 2009/0322165 A1 * | 12/2009 | Rittenhouse | H02K 21/125 318/400.26 |
| 2010/0085138 A1 | 4/2010 | Vail | |
| 2010/0195353 A1 | 8/2010 | Nishiyama et al. | |
| 2011/0032683 A1 | 2/2011 | Li et al. | |
| 2012/0257421 A1 | 10/2012 | Brkovic | |
| 2013/0320940 A1 | 12/2013 | Dimitrovski | |
| 2014/0185337 A1 * | 7/2014 | Espino | H01F 27/36 363/21.17 |
| 2014/0218012 A1 * | 8/2014 | Umetani | G01R 33/02 324/117 R |
| 2015/0008757 A1 | 1/2015 | Scholz et al. | |
| 2016/0358705 A1 * | 12/2016 | Lin | H02M 1/40 |
| 2021/0313895 A1 * | 10/2021 | Schaible | H01F 3/10 |
| 2022/0311324 A1 * | 9/2022 | Sato | H02M 3/1584 |

FOREIGN PATENT DOCUMENTS

| | | |
|---|---|---|
| CN | 103460309 A | 12/2013 |
| CN | 106405260 A | 2/2017 |
| DE | 102013009587 A1 | 12/2013 |
| GB | 2042277 A | 9/1980 |
| JP | H07130554 A | 5/1995 |
| JP | 2005191256 A | 7/2005 |
| JP | 2010027946 A | 2/2010 |
| JP | 2017098415 A | 6/2017 |
| RU | 2168230 C2 | 5/2001 |
| WO | 2014061113 A1 | 4/2014 |
| WO | 2018158339 A1 | 9/2018 |

OTHER PUBLICATIONS

U.S. Appl. No. 17/622,178, Non-Final Office Action mailed Nov. 29, 2024; 9 pages.
Chinese Application Serial No. 202080056726.0, First Office Action with Search Report with Machine Translation, mailed Aug. 29, 2024; 16 pages.

(56) References Cited

OTHER PUBLICATIONS

Chinese Application No. 202080056816.X; First Office Action, Search Report with Machine Translation; mailed Nov. 11, 2024, 10 pages.
PCT Application Serial No. PCT/US2020/046612, International Preliminary Report On Patentability, mailed Mar. 3, 2022, 7 pages.
PCT Application Serial No. PCT/US2020/046617, International Preliminary Report On Patentability, mailed Mar. 3, 2022, 6 pages.
PCT Application Serial No. PCT/US2020/046621, International Preliminary Report On Patentability, mailed Mar. 3, 2022, 12 pages.
Esser A: "Contactless Charging and Communication for Electric Vehicles", vol. 1, No. 6, Nov. 1, 1995 (Nov. 1, 1995), 1077-2618, figures 1,2; 8 pages.
PCT Application No. PCT/US2020/046612; International Search Report and Written Opinion of the International Searching Authority; Oct. 28, 2020; 11 pages.
PCT Application No. PCT/US2020/046617; International Search Report and Written Opinion of the International Searching Authority; Oct. 30, 2020; 9 pages.
PCT Application No. PCT/US2020/046621; International Search Report and Written Opinion of the International Searching Authority; Nov. 20, 2020; 16 pages.
Sonja Klopper et al: "A Sensor for Balancing Flux in Converters with a High-Frequency Transformer Link", vol. 33, No. 3, Jun. 1, 1997; 6 pages.
Machine Translation of DE102013009587; Klopcic Beno, et al., "Measuring device for detecting saturation of magnetic core of transformer in direct current static converter", 6 pages.
Machine Translation of JP2010027946; Sakita Koichi, "Magnetic Core", 7 pages.
U.S. Appl. No. 17/620,057; "Notice of Allowance"; mailed Feb. 7, 2025; 16 pages.

Chinese Application Serial No. 202080056726.0, Second Office Action Issued Feb. 25, 2025, and Search Report Dated Feb. 22, 2025, with Machine Translation, 17 pages.
Chinese Application Serial No. 202080056805.1, First Office Action Issued Jan. 15, 2025, and Search Report Dated Jan. 13, 2025, with Machine Translation, 10 pages.
E. Osegueda, K. D. T. Ngo, W. M. Polivka and M. M. Walters, "Perforated-plate magnetics. I. Mode-1 inductor/ transformer," in IEEE Transactions on Aerospace and Electronic Systems, vol. 31, No. 3, pp. 968-976, Jul. 1995.
Polivka, William M. (1984) Applications of Magnetics to Problems in Switched-Mode Power Conversion. Dissertation (Ph.D.), California Institute of Technology. doi: 10.7907/31G4-8128. https://resolver.caltech.edu/CaltechETD: etd-01022007-112439, 273 pages.
S. Kirli, K. D. T. Ngo, W. M. Polivka and M. M. Walters, "Inductance modeling for a mode-2 perforated-plate matrix inductor/transformer," Proceedings of IEEE Power Electronics Specialist Conference—PESC '93, Seattle, WA, USA, 1993, pp. 1130-1136.
S. Kirli, K. D. T. Ngo, W. M. Polivka and M. M. Walters, "Perforated-plate magnetics. Il. Mode-2 inductor/transformer," in IEEE Transactions on Aerospace and Electronic Systems, vol. 31, No. 3, pp. 977-986, Jul. 1995.
W. M. Polivka, et al., "Detection of Magnetic Saturation in Switching Converters," in Proc. Power Convers. Int. Conf., Mar. 1982, pp. 584-597. Also, in Advances in Switched-Mode Power Conversion, vol. III, Pasadena, CA: TESLAco, 1983, pp. 103-118.
W. Polivka, A. Cocconi, and S. Cuk, "Use of Orthogonal Flux to Detect Impending Magnetic Saturation in Switching Converters, " Advances in Switched-Mode Power Conversion, vol. III, Pasadena, CA: TESLAco, 1983, pp. 119-149.
CN Application No. 202080056726.0; "Decision on Rejection with Machine Translation"; mailed Jun. 30, 2025; 15 pages.

* cited by examiner

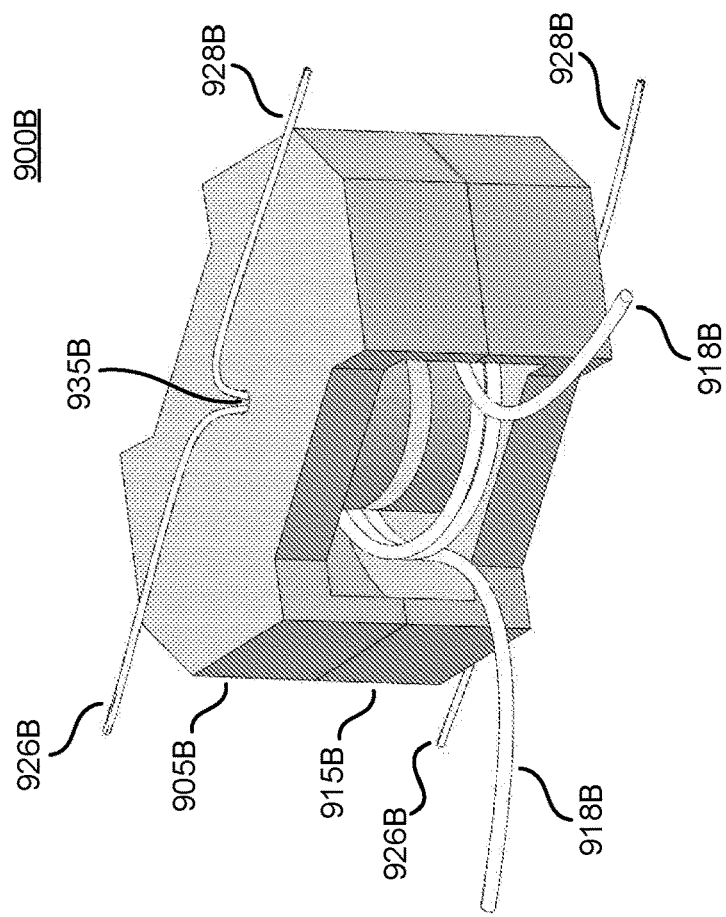
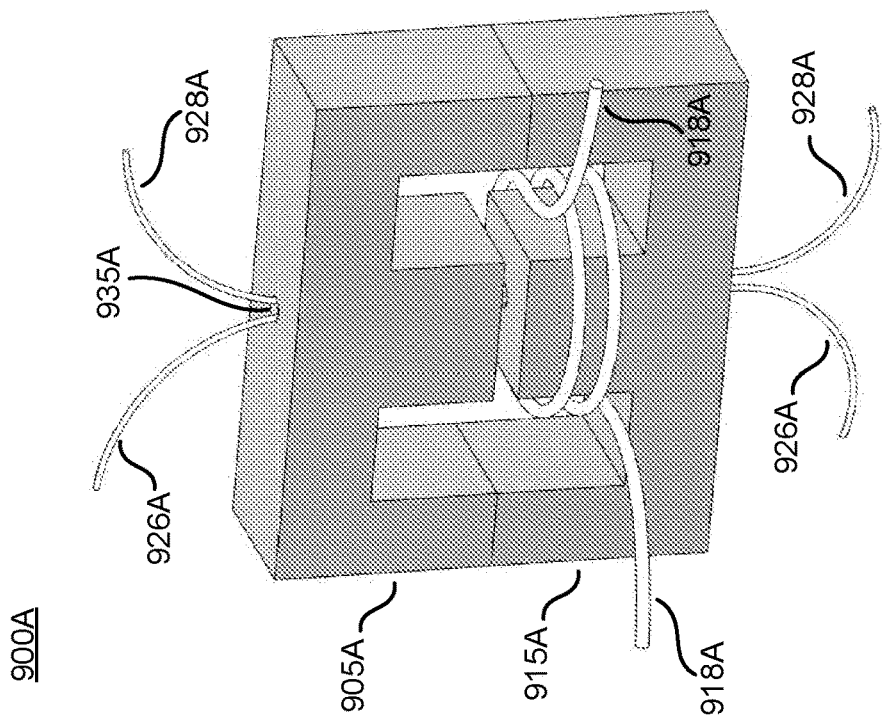
FIG. 9B
FIG. 9A

MAGNETIC SATURATION DETECTOR WITH SINGLE AND MULTIPLE TRANSVERSE WINDINGS

This application is a National Stage Entry of International Application No. PCT/US2020/046612 filed on Aug. 17, 2020, which claims the benefit of U.S. Provisional Application No. 62/887,810, filed Aug. 16, 2019, the contents of which are incorporated in their entirety herein by reference.

RELATED APPLICATIONS

This patent application is related to patent application 62/888,194, "Core Assemblies for Magnetic Saturation Detector without Requirement for DC Bias" and to patent application 62/888,089, entitled, "Energy Transfer Element Including a Communication Element," each of which is filed on even date herewith, each of which is assigned to the common assignee, and each of which has one common inventor. Each of the Related Applications is incorporated herein by reference in its entirety.

BACKGROUND OF THE INVENTION

Field of the Invention

The present invention relates generally to magnetic energy transfer elements, and more specifically to magnetic energy transfer elements in power converters.

Discussion of the Related Art

Electronic devices use power to operate. Switched mode power supplies are commonly used due to their high efficiency, small size and low weight to power the electronic circuits in many of today's products. Conventional wall sockets provide a source of high voltage alternating current. In a switching power supply, a power converter receives an input of high voltage alternating current (ac) that is converted to provide a usually well-regulated direct current (dc) output at a typically lower voltage suitable for electronic circuits. In operation, a switch in a switched mode power converter is controlled to vary a duty ratio, a switching frequency, or an average number of pulses per unit time to produce the desired output of the power supply.

A switched mode power converter typically uses at least one magnetic component that stores energy from an input and delivers the energy to one or more outputs. Such magnetic components are generally known as magnetic energy transfer elements.

The magnetic energy transfer elements typically rely on properties of magnetically active materials such as ferrites and metal alloys to reduce the physical volume required to contain the stored energy. The materials direct magnetic fields from electric currents to regions where the energy can be stored at high density. Magnetically active materials generally possess their desirable properties only when the intensity of the magnetic field is less than a threshold magnitude known as the saturation flux density. When the intensity of the magnetic field exceeds the saturation flux density, the desirable properties of the magnetically active material decrease rapidly with increasing magnetic field. The loss of the desirable magnetic properties with increasing magnetic field reduces the energy that the magnetic component can store from a given current, and as a consequence, may allow a rapid increase in current that can damage electrical components.

It is desirable to know when the magnetic field in a magnetic energy storage element reaches its saturation flux density so that a power converter may operate safely at its maximum power capability.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 9A is a perspective view of an example energy transfer element using a modified standard magnetic core configuration that may be included in a magnetic saturation detector, in accordance with embodiments of the present disclosure.

FIG. 9B is a perspective view of an example energy transfer element using a standard magnetic core configuration that may be included in a magnetic saturation detector, in accordance with embodiments of the present disclosure.

Figure 1A:
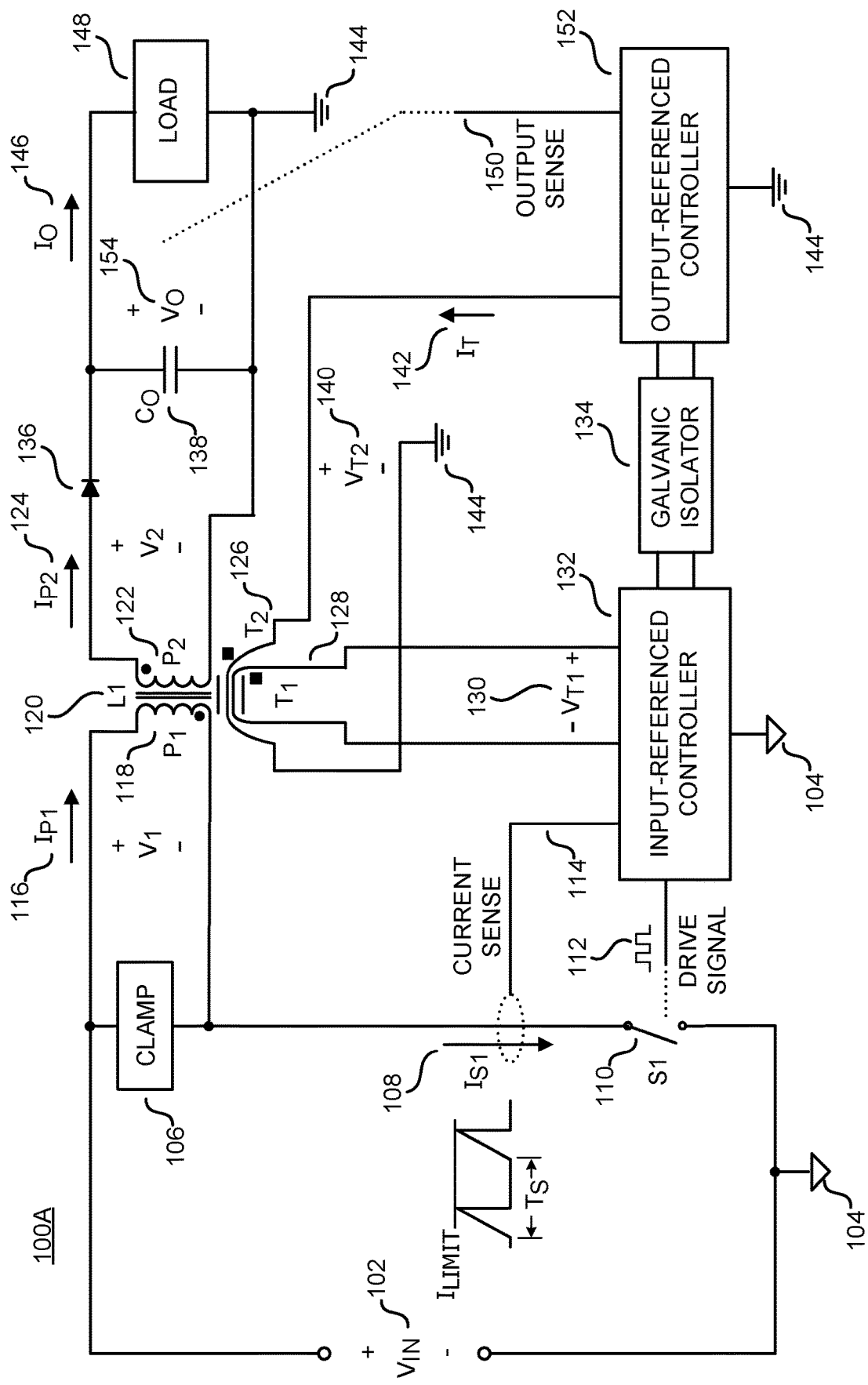
FIG. 1A is a schematic diagram of an example power supply that includes a switched mode power converter with a magnetic saturation detector, in accordance with embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

FIG. 1A is a schematic diagram 100A of an example power supply configured to operate with a magnetic saturation detector. The example power supply of FIG. 1A receives an input voltage $V_{IN}$ 102 with respect to an input return 104 and provides a regulated output to a load 148. The regulated output may be a voltage $V_O$ 154 with respect to an output return 144, a current $I_O$ 146, or a combination of both.

The example power supply of FIG. 1A uses a flyback power converter to produce an output that is galvanically isolated from the input. In other words, a voltage applied between the input return 104 and the output return 144 would produce negligible current. The flyback power converter in the example power supply of FIG. 1A includes an energy transfer element L1 120 that has an input power winding $P_1$ 118, output power winding $P_2$ 122, a first transverse winding $T_1$ 128 and a second transverse winding $T_2$ 126. Power windings $P_1$ 118 and $P_2$ 122 take part principally in the transfer of energy between the input and the output, whereas transverse windings $T_1$ 128 and $T_2$ 126 take part principally in the detection of magnetic saturation.

The symbol in FIG. 1A that represents energy transfer element L1 120 uses the dot convention to represent voltage polarities on windings. The circular dots on power windings $P_1$ 118 and $P_2$ 122 indicate that the ends of the windings with the dots have the same voltage polarity with respect to the end of the same winding without the dot. For example, if the dotted end of one power winding is positive with respect to the non-dotted end, the dotted ends of all power windings are positive with respect to their non-dotted ends. Similarly, the square dots on transverse windings $T_1$ 128 and $T_2$ 126 indicate that the ends of the transverse windings with the dots have the same voltage polarity with respect to the end of the same transverse winding without a dot. The dots on the power windings have a different shape than the dots on the transverse windings to indicate that the polarity of a power winding is not necessarily the polarity of a transverse winding, as will become apparent from the description of the construction of energy transfer element L1 120 later in this disclosure.

A clamp circuit 106 is coupled across the input power winding $P_1$ 118. An input switch S1 110 is coupled between the input power winding $P_1$ 118 and the input return 104.

In operation, an input-referenced controller 104 receives signals from an output-referenced controller 152 through a galvanic isolator 134 to produce a drive signal 112 that opens and closes the input switch S1 110. An open switch cannot conduct current, whereas a closed switch may conduct current. The input-referenced controller 132 senses current $I_{S1}$ 108 in the input switch S1 110 as a current sense signal 114. In one mode of operation, input-referenced controller 132 may open input switch S1 110 when the current $I_{S1}$ 108 reaches a threshold value. In another mode of operation that will be explained later in this disclosure, the input-referenced controller 132 may open input switch S1 110 when energy transfer element L1 120 reaches a state of impending magnetic saturation.

The switching of switch S1 110 produces pulsating currents $I_{P1}$ 116 and $I_{P2}$ 124 in the respective power windings $P_1$ 118 and $P_2$ 122 of energy transfer element L1 120, as well as pulsating voltages $V_1$ and $V_2$ across those respective windings. Clamp circuit 106 prevents excess voltage on input power switch S1 110 when the switch opens. Output winding current $I_{P2}$ 124 from output power winding $P_2$ 122 is rectified by diode 136 and filtered by output capacitor $C_O$ 138 to produce an output voltage $V_O$ 154 and an output current $I_O$ 146 at a load 148. Either the output voltage $V_O$ 154, the output current $I_O$ 146, or a combination of both may be sensed as an output sense signal 150 by the output-referenced controller 152. The output-referenced controller compares the sensed output quantity to a reference value, and communicates with the input-referenced controller 132 through a galvanic isolator circuit 134 to switch the input switch S1 110 appropriately to obtain the desired output values. The galvanic isolator circuit 134 may include any of the many known ways use to use optical, magnetic, and capacitive technologies to couple signals between galvanically isolated circuits.

In the example power supply of FIG. 1A, transverse winding $T_2$ 126 receives a transverse current $I_T$ 142 from output-referenced controller 152. Transverse current $I_T$ 142 is typically a constant current that provides a transverse magnetic flux density within energy transfer element L1 120, producing transverse voltages $V_{T1}$ 130 and $V_{T2}$ 140 on respective transverse windings $T_1$ 128 and $T_2$ 126 to indicate magnetic saturation. Since transverse windings $T_1$ 128 and $T_2$ 128 are galvanically isolated, either the input referenced controller 132 or the output-referenced controller 152 may sense respective transverse voltages $V_{T1}$ 130 and $V_{T2}$ 140 to provide detection of magnetic saturation, and either controller may provide transverse current in one of the transverse windings. In the example of FIG. 1A, the input-referenced controller 132 and the output-referenced controller 152 are components of a regulator that maintains an output of the power supply by providing an appropriate drive signal 112 from inputs of the current sense signal 114, the output sense signal 150, and either of the transverse voltages 130 and 140.

Control circuits need a bias voltage to provide power for operation. It is generally preferable to provide the transverse current from the controller that operates from the lower bias voltage to reduce power dissipation in the controller. Therefore, since power supplies typically produce an output voltage that is substantially lower than the input voltage, and power supplies typically control a switch on the input, it may be advantageous in practice for the output-referenced controller to provide the transverse current, and for the input-referenced controller to have the circuits that observe the transverse voltage to detect magnetic saturation.

Figure 1B:
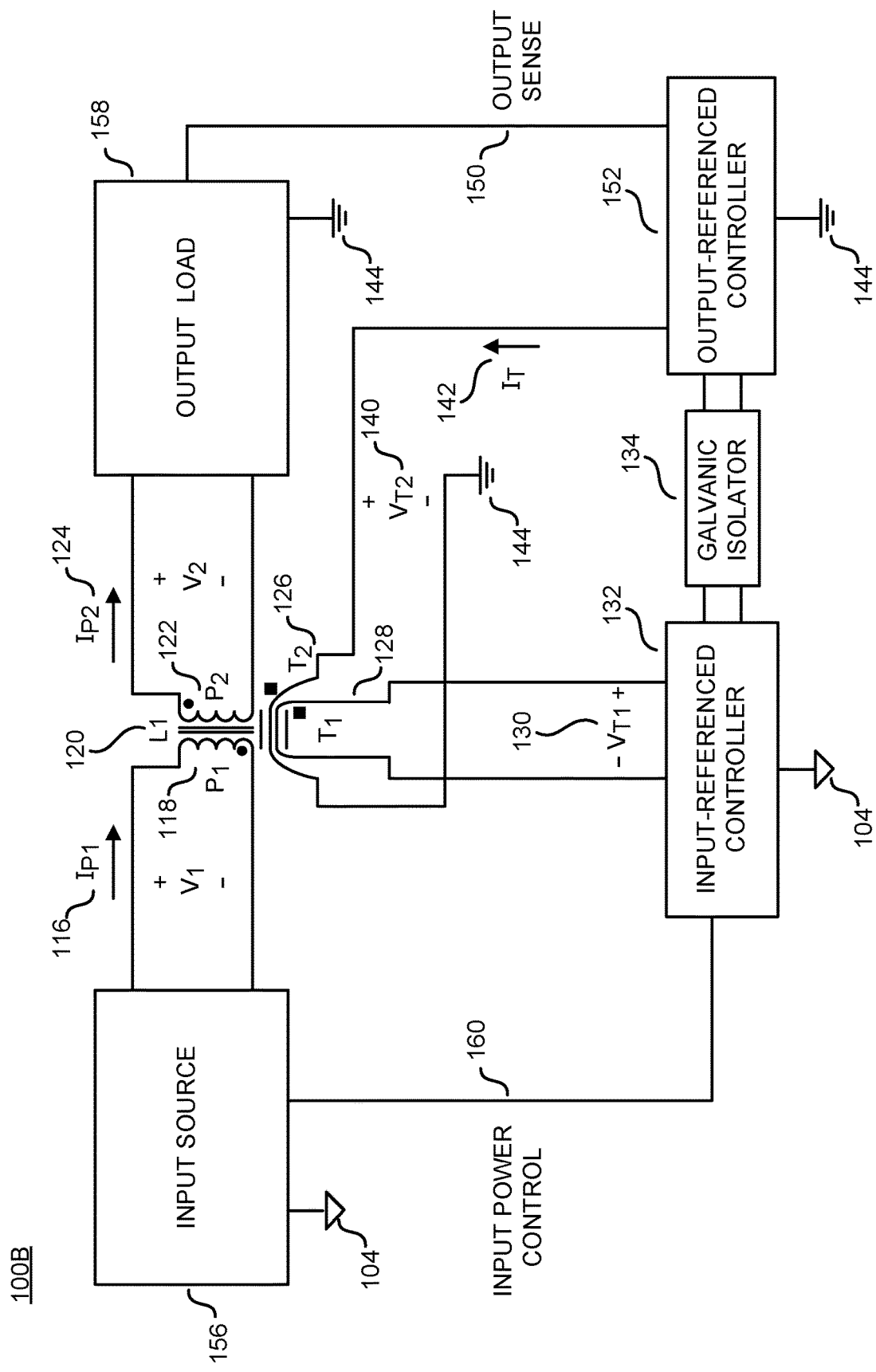
FIG. 1B is a schematic diagram of an example power system with galvanic isolation that includes a magnetic saturation detector, in accordance with embodiments of the present disclosure.

FIG. 1B is a schematic diagram 100B of an example power system with galvanic isolation that includes a magnetic saturation detector. The example power system of FIG. 1B uses an energy transfer element L1 120 to control power from an input source 156 to an output load 158. In the example of FIG. 1A, input source 156 has an input return 104 that is galvanically isolated from output load 158 that has an output return 144. As in the example power supply of FIG. 1A, the energy transfer element L1 120 has an input power winding $P_1$ 118, output power winding $P_2$ 122, a first transverse winding $T_1$ 128 and a second transverse winding $T_2$ 126. Power windings $P_1$ 118 and $P_2$ 122 take part principally in the transfer of energy between the input and the output, whereas transverse windings $T_1$ 128 and $T_2$ 126 take part principally in the detection of magnetic saturation. In the example of FIG. 1B, the input-referenced controller 132 and the output-referenced controller 152 are components of a regulator that maintains an output of the power system by providing an appropriate input power control signal 160 from inputs of the output sense signal 150 and either of the transverse voltages 130 and 140.

In operation, an input-referenced controller 132 receives signals from an output-referenced controller 152 through a galvanic isolator 134 to produce an input power control signal 160 that applies a time-varying voltage $V_1$ that may result in a time-varying current $I_{P1}$ 116 in input winding $P_1$ 118.

The application of voltage $V_1$ to input power winding $P_1$ 118 produces voltage $V_2$ at output power winding $P_2$ 122, that may result in a time-varying current $IP_2$ in output winding $P_2$ 122. Output current $IP_2$ 124 together with output voltage $V_2$ deliver power to the output load 158. An output-referenced controller 152 senses an output quantity as an output sense signal 150, compares the sensed output quantity to a reference value, and communicates with the input-referenced controller 132 through a galvanic isolator circuit 134 to switch the input switch S1 110 appropriately to obtain the desired output values. The galvanic isolator circuit 134 may include any of the many known ways use to use optical, magnetic, and capacitive technologies to couple signals between galvanically isolated circuits.

In the example power supply of FIG. 1B, transverse winding $T_2$ 126 receives a transverse current $I_T$ 142 from output-referenced controller 152. Transverse current $I_T$ 142 is typically a constant current that provides a transverse magnetic flux density within energy transfer element L1 120, producing transverse voltages $VT_1$ 130 and $VT_2$ 140 on respective transverse windings $T_1$ 128 and $T_2$ 126 to indicate magnetic saturation. Since transverse windings $T_1$ 128 and $T_2$ 128 are galvanically isolated, either the input referenced controller 132 or the output-referenced controller 152 may sense respective transverse voltages $VT_1$ 130 and $VT_2$ 140 to provide detection of magnetic saturation, and either controller may provide transverse current in one of the transverse windings.

Figure 2B:
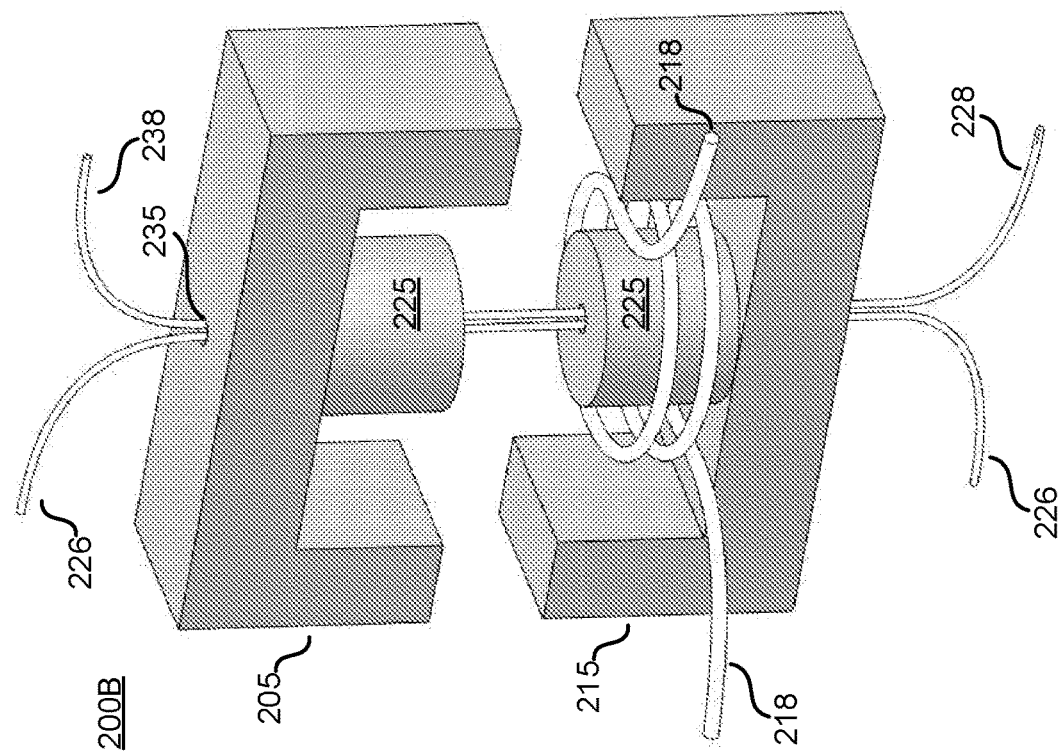
FIG. 2B is an exploded perspective view of the example energy transfer element of FIG. 2A with upper and lower pieces separated to show transverse windings passing through the center post of each piece, in accordance with embodiments of the present disclosure.
Figure 2A:
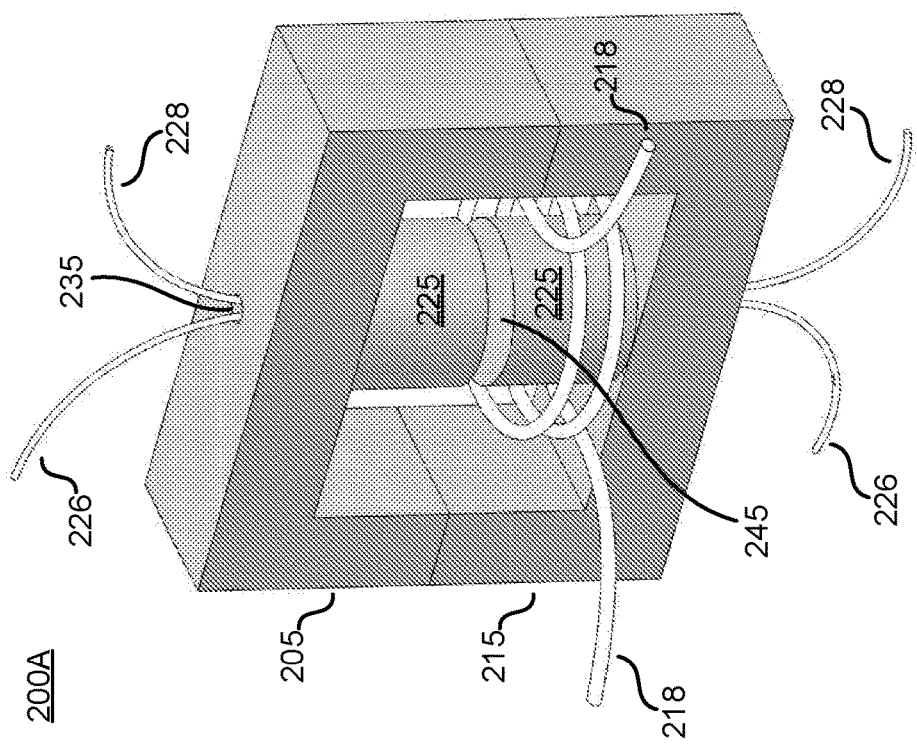
FIG. 2A is a perspective view of an example energy transfer element that may be included in a magnetic saturation detector, in accordance with embodiments of the present disclosure.

FIG. 2A and FIG. 2B illustrate the salient features of the construction of an example energy transfer element that may be included in a power supply that operates with a magnetic saturation detector. FIG. 2A is a perspective view 200A that shows an upper core piece, e.g. an upper magnetic core-half 205, assembled over a lower core piece, e.g. a lower magnetic core-half 215. Each magnetic core-half has a center post 225 surrounded by a winding 218 that represents one or more power windings, such as $P_1$ 118 and $P_2$ 122 in FIG. 1A. In a practical component, the turns of the power windings typically would be placed on a separate spool, sometimes referred to as a bobbin or a coil former, that would fit over the center posts to facilitate assembly. FIG. 2A shows a gap 245 in the center post of the assembled core-halves. The dimension of the gap is typically selected along with the number of turns on the power windings to set the electrical parameters desired for a particular application. In some applications, the gap contains a permanent magnet to provide a flux density offset to the flux density produced by current in a power winding. In some examples, the gap 245 may be distributed among the three vertical sections by inserting physical spacers of appropriate material between the core-halves so that each vertical section has a gap of a desired dimension.

FIG. 2A also shows transverse windings 226 and 228 that pass through an aperture 235 in the center post 225 of each core-half such that the transverse windings are perpendicular to the power winding 218. Each transverse winding is typically a single turn, although a transverse winding may include more than one turn to amplify the voltage produced by the windings. FIG. 2B is a perspective view 200B of the example energy transfer element of FIG. 2A with the upper core-half 205 and lower core-half 205 separated to show the transverse windings 226 and 238 passing through the aperture in the lower core-half 215. It is appreciated that a transverse winding need not be geometrically perpendicular to the power winding. Any conductor that passes completely through a turn of a power winding in one direction at any angle may be a transverse winding.

It will be appreciated by those skilled in the art that magnetic assemblies and parts of magnetic assemblies may be described by various terms that are not necessarily technically accurate nor precise. For example, virtually any piece of magnetic material may be referred to as a magnetic core. A complete assembly of pieces of magnetic components exclusive of windings may also typically be referred to as a magnetic core. Assemblies of magnetic cores typically comprise two core pieces. In many assemblies of magnetic cores, such as in the example of FIG. 2A, the two core pieces may be nearly identical. Hence, each core piece may be commonly referred to as a core member or core-half. In practice, the gap in a center post, such as the gap 245 in the assembly of FIG. 2A for example, may be formed by removing material from the center post of only one of two identical core-halves. Each piece is still referred to as a core-half even though the piece that forms the gap is no longer identical to the piece that had no material removed. The assembly may be further referred to as a core pair. In this disclosure the term core-half may be used to refer to one of two nearly identical pieces in an assembly to distinguish the assembly from alternative assemblies comprising pieces that are obviously not identical. For example, an assembly of two E-shaped pieces may have the same geometrical features and magnetic properties as an assembly that uses one E-shaped piece with one I-shaped piece. The EE assembly comprises two core-halves whereas the EI assembly does not, although each assembly comprises two core members. It is noted that in the practice of the art each one of a magnetic core piece, a magnetic core member, a magnetic core element, a magnetic core-half, and a magnetic core assembly may be referred to as a magnetic core.

Figure 3A:
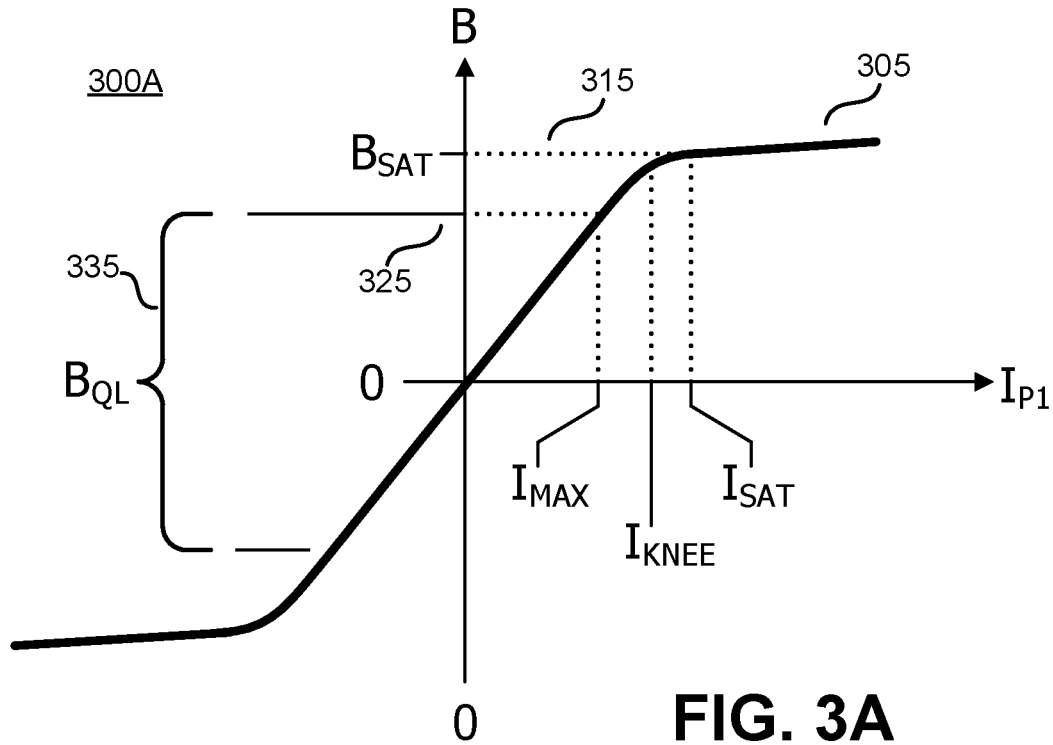
FIG. 3A is a graph of magnetic flux density in an example magnetic energy transfer element with respect to the current in a power winding of the energy transfer element, in accordance with embodiments of the present disclosure.
Figure 3B:
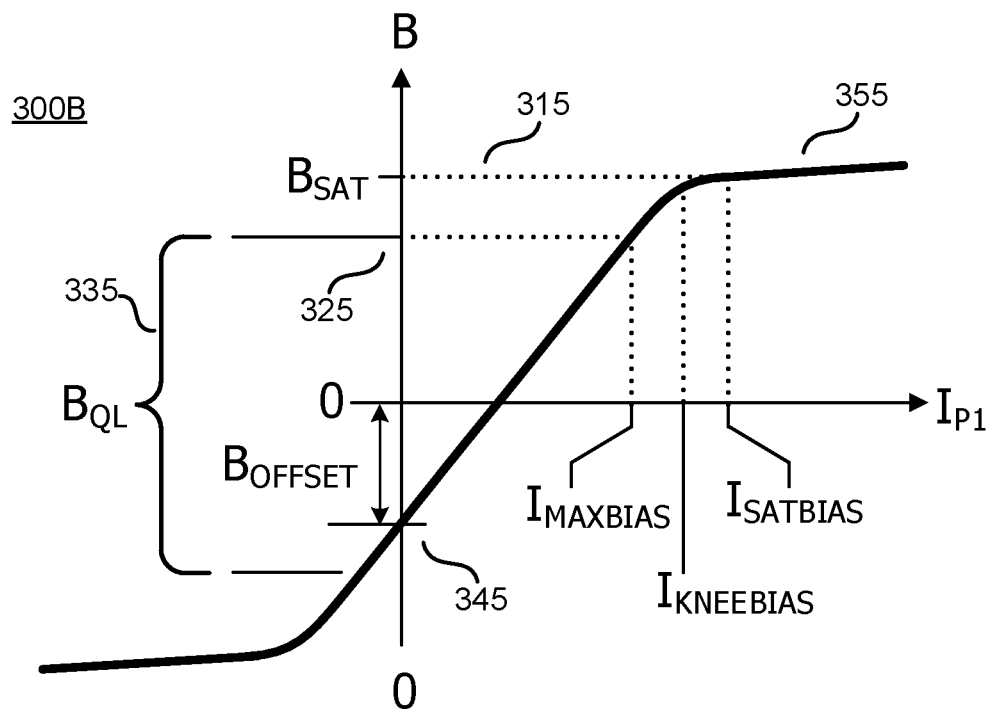
FIG. 3B is a graph of magnetic flux density in an example magnetic energy transfer element with respect to the current in a power winding of the energy transfer element when the energy transfer element includes a permanent magnet to provide an offset flux density, in accordance with embodiments of the present disclosure.

FIG. 3A and FIG. 3B graphically illustrate the relationships between magnetic flux density in an energy transfer element and the current in a power winding of the energy transfer element. FIG. 3A is a graph 300A that shows magnetic flux density plotted on the vertical axis with respect to a power winding current such as for example $I_{P1}$ in the power supply of FIG. 1A on the horizontal axis. The example energy transfer element for the graph of FIG. 3A has no flux density offset from a permanent magnet, so the flux density is at zero when the current is at zero. Flux density from the transverse windings is typically low enough to have negligible contribution to the behavior illustrated in the graph.

The magnetic flux density curve 305 in FIG. 3A highlights several distinguishing features. The curve 305 takes on positive and negative values with symmetry about the origin on both axes. There is positive flux density for positive current and negative flux density for negative current. Features are emphasized for positive values of current in the graph because the current in the example circuit of FIG. 1A is in only one direction. As the current $I_{P1}$ increases from zero, the energy transfer element operates in a quasi-linear region $B_{QL}$ 335 until the current reaches a maximum value $I_{MAX}$ that corresponds to the upper boundary 325 of the quasi-linear region. The slope of the curve 305 in the quasi-linear region 335 is positive and relatively constant. In other words, the flux density increases with increasing current at a nearly constant ratio. As the current increases beyond $I_{MAX}$, the slope of the flux density curve 305 decreases, reaching a lower relatively constant value for currents greater than a saturation current $I_{SAT}$ that corresponds to a saturation flux density $B_{SAT}$ 315. It is important to detect operation at the saturation flux density $B_{SAT}$ 315 because operation at higher values of flux density is likely to produce current that may damage switching devices and other components in a power supply. As the slope of the curve 305 changes from its nearly constant value in the quasi-linear region $B_{QL}$ 335 where the current is less than $I_{MAX}$ to its much lower nearly constant value where the current is greater than $I_{SAT}$, there is region where the slope is changing rapidly between the two nearly constant values. The current between $I_{MAX}$ and $I_{SAT}$ where the slope of the flux density is changing most rapidly is identified as $I_{KNEE}$ since it corresponds to the relatively sharp bend in the flux density curve 305. A magnetic saturation detector may indicate operation at the flux density corresponding to current $I_{KNEE}$ so that operation at currents greater than $I_{SAT}$ may be avoided.

FIG. 3B is a graph 300B that shows magnetic flux density plotted on the vertical axis with respect to a power winding current such as for example $IP_1$ in the power supply of FIG. 1A on the horizontal axis. In contrast to the graph of FIG. 3A, the example energy transfer element for the graph of FIG. 3B has a flux density offset from a permanent magnet.

The flux density offset from the permanent magnet shifts the curve 305 of FIG. 3A to the right on the horizontal axis as shown by the curve 355 in FIG. 3B. The values on the vertical axis for the saturation flux density $B_{SAT}$ 315 and the quasi-linear region $B_{QL}$ 335 are unchanged because they are intrinsic properties of the magnetic material of the core. A flux density offset can change the relationship between the flux density and an external stimulus, but it cannot change the intrinsic properties of the magnetic material. The flux density offset from a permanent magnet, such as for example one that may be placed in the gap 245 of the assembly illustrated in FIG. 2A, is shown in FIG. 3B as $B_{OFFSET}$ that produces a negative flux density 345 in the energy transfer element when the current $I_{P1}$ on the horizontal axis is zero. As in FIG. 3A, flux density from the transverse windings is typically low enough to have negligible contribution to the behavior illustrated in the graph.

The flux density offset increases the values of the current $I_{P1}$ required to reach the upper boundary 325 of the quasi-linear region $B_{QL}$ 355, the saturation value $B_{SAT}$ 315, and the flux density where the slope of the curve is changing most rapidly. In other words, currents $I_{MAX}$, $I_{SAT}$, and $I_{KNEE}$ of FIG. 3A are respectively increased to $I_{MAXBIAS}$, $I_{SATBIAS}$, and $I_{KNEEBIAS}$ in FIG. 3B. Therefore, in energy transfer elements that use a permanent magnet to provide a flux density offset, the magnetic saturation detector may indicate operation at the flux density corresponding to current $I_{KNEEBIAS}$ so that operation at currents greater than $I_{SATBIAS}$ may be avoided.

Figure 4:
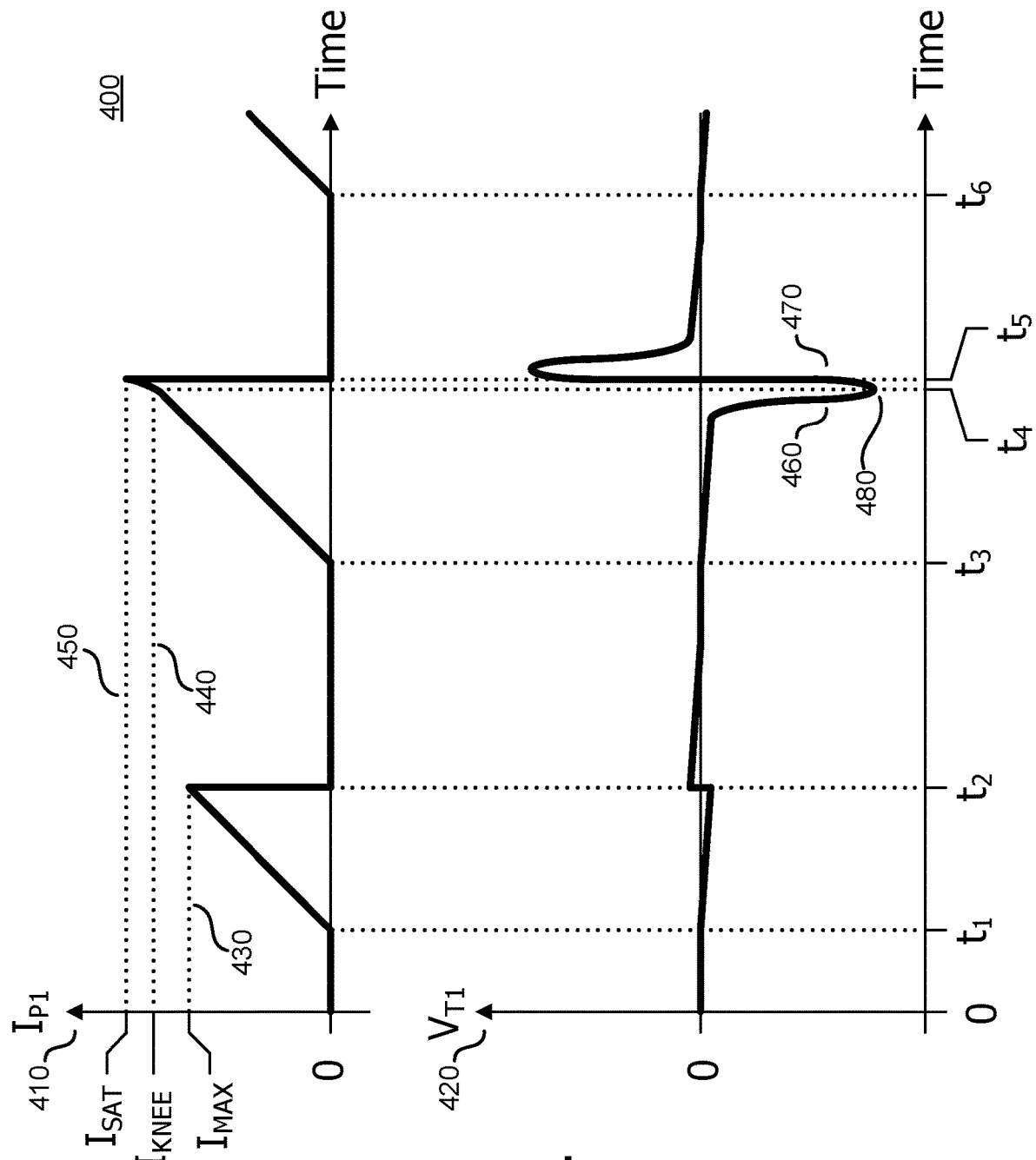
FIG. 4 is a graph showing the waveform of current in a power winding of an energy transfer element with the waveform of voltage on a transverse winding of the energy transfer element, in accordance with embodiments of the present disclosure.

FIG. 4 is a graph 400 that shows a waveform of current in a power winding and a waveform of voltage on a transverse winding from an example energy transfer element that may operate in the example power supply of FIG. 1A. Current $I_{P1}$ is plotted on the vertical axis 410 and transverse voltage $V_{T1}$ is plotted on vertical axis 420, both with respect to time on the horizontal axis.

The current is the result of the input voltage $V_{IN}$ 102 across power winding $P_1$ 118 of energy transfer element L1 120 when switch S1 110 closes and opens. The transverse voltage $VT_1$ 160 on transverse winding $T_1$ 128 arises from a well-known mechanism that exploits the magnetic saturation characteristic of the magnetic material to produce a voltage on a transverse winding. The saturation characteristic describes the behavior of the total flux density that is the vector sum of two components: a principal component of flux density produced by current in a power winding and a transverse component of flux density produced by current in a transverse winding. The vectors of the two components are perpendicular to each other in the magnetic material. An increase in current in the power winding forces the principal component to increase in magnitude, even when the total flux density is near the saturation value. Since the saturation characteristic limits the increase in the sum of the two vectors, an increase in the principal component when the total flux density is near the saturation value forces the transverse component to decrease, even though the transverse component may be produced by a constant transverse current. The forced decrease in the transverse component of flux density produces voltage on all the transverse windings. When the total flux density is in the quasi-linear region ($B_{QL}$ 355 in FIG. 3A and FIG. 3B), the transverse flux density is virtually independent of the principle flux density, and current in the power windings produces virtually no voltage on the transverse windings. Thus, features of the time-varying voltage on the transverse winding may be interpreted to detect magnetic saturation in the energy transfer element.

To produce the example waveforms of FIG. 4, switch S1 110 in the example power supply of FIG. 1A closes at time $t_1$. Between time $t_1$ and time $t_2$ current $I_{P1}$ increases from zero to the value $I_{MAX}$ 430 and the flux density increases from zero to the upper boundary 325 of the quasi-linear region $B_{QL}$ 335 of the flux density characteristic shown in FIG. 3A when input-referenced controller 132 opens the switch. If the flux density curve 305 were perfectly linear, the voltage $VT_1$ would remain at zero between time $t_1$ and time $t_2$. The slight departure from zero near time $t_2$ is evidence that the slope of the curve is beginning to decrease as the current approaches $I_{MAX}$ at the end of the quasi-linear region $B_{QL}$ 335. When switch S1 110 opens at time $t_2$, current in power winding $P_1$ 118 goes from $I_{MAX}$ to zero while current in power winding $P_2$ 122 increases from zero to a value required to maintain the flux density that corresponds to current $I_{MAX}$ in power winding $P_1$ 118. The transverse voltage $V_{T1}$ changes polarity at time $t_2$ because the changing flux density that produces the voltage on the windings decreases after the switch opens, whereas the flux density increases while the switch is closed. In the example of FIG. 4, the flux density decreases to zero between time $t_2$ and time $t_3$.

When switch S1 110 closes again at time $t_3$, current $I_{P1}$ again increases from zero, rising to exceed both $I_{MAX}$ 430 and $I_{KNEE}$ 440, reaching $I_{SAT}$ 450 before the input-referenced controller 132 opens the switch. As the increasing current $I_{P1}$ exceeds $I_{MAX}$ 430, the flux density leaves the quasi-linear range $B_{QL}$ 335, and transverse voltage $VT_1$ rapidly becomes more negative with a substantial negative slope 460. The transverse voltage $VT_1$ attains a maximum negative value 480 at time $t_4$ that corresponds to current $I_{P1}$ at $I_{KNEE}$ 440. The transverse voltage $VT_1$ becomes less negative with a substantial positive slope 470 as current $I_{P1}$ passes through $I_{KNEE}$ and approaches its final value of $I_{SAT}$ 450 at time $t_5$, where input-referenced controller 132 opens the switch. Transverse voltage $VT_1$ becomes more positive and reaches a maximum positive value as the flux density decreases to zero between time $t_5$ and time $t_6$.

Figure 5:
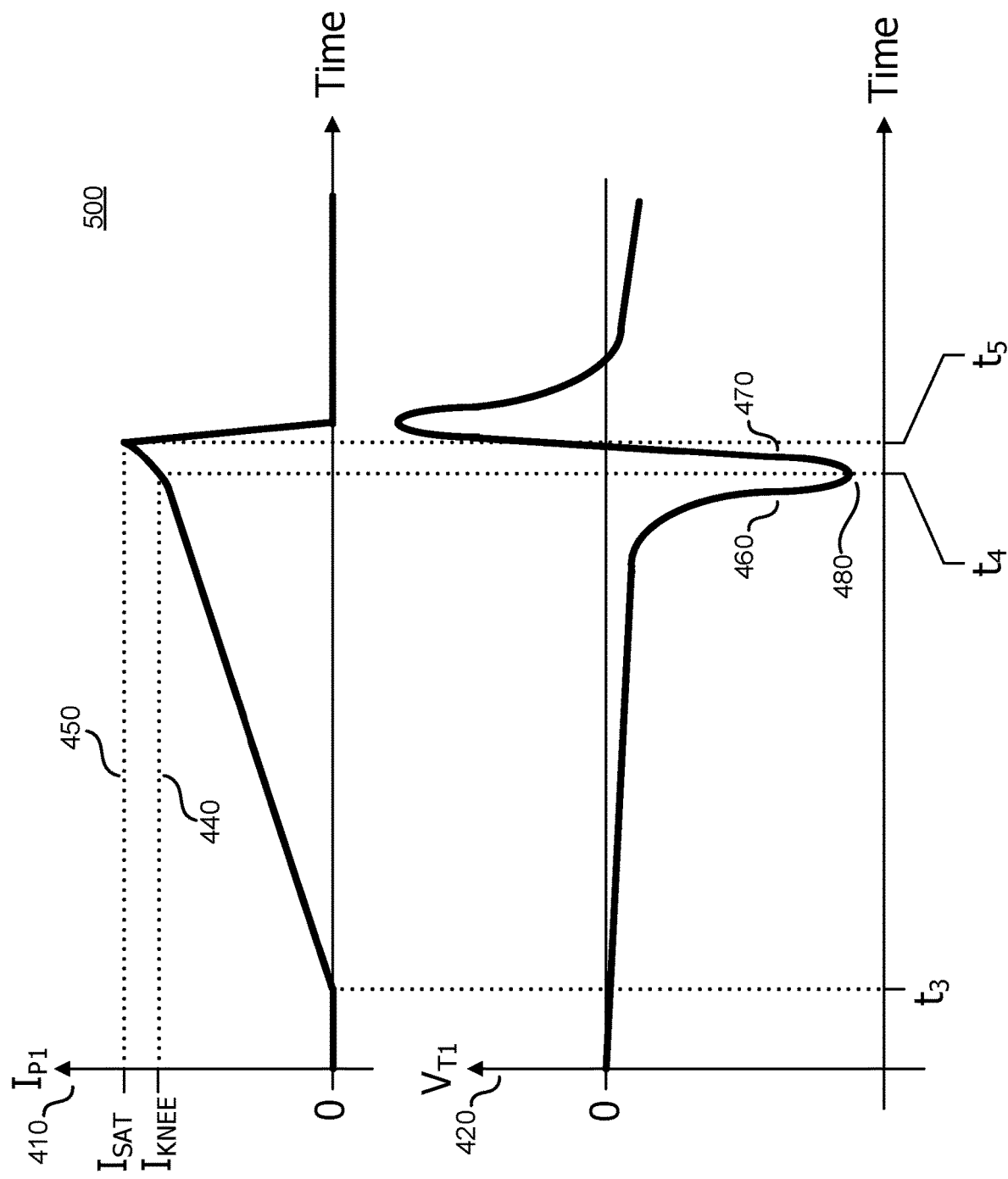
FIG. 5 is an expanded portion of the graph of FIG. 4 showing greater detail, in accordance with embodiments of the present disclosure.

FIG. 5 is an expanded view 500 of the waveforms in FIG. 4 showing greater detail near times $t_4$ and $t_5$. The expansion emphasizes the characteristics of a transverse voltage waveform that allow a circuit to detect magnetic saturation from observation of the voltage on a transverse winding.

FIG. 5 shows an extremum 480 in the waveform of the transverse voltage $VT_1$ when current $IP_1$ is at the value $I_{KNEE}$ 440. Although the extremum 480 is a valley in the example of FIG. 5, the polarity of the voltage on the transverse winding may be reversed simply by interchanging the two ends of the winding at the voltage sensing terminals or by reversing the direction of the transverse current $I_T$ 142 to make the extremum a peak instead of a valley.

A characteristic of the extremum that is independent of the polarity is the change in the sign of the slope of the waveform from before the time $t_4$ to after the time $t_4$. FIG. 5 shows a negative slope on the portion 460 before $t_4$ and a positive slope on the portion 470 after $t_4$. The change in sign of the slope of the voltage on the transverse winding is an indication of magnetic saturation. If the polarity of the transverse winding were reversed, the slope would be positive before $t_4$ and negative after $t_4$. The change in sign of the slope is also independent of the magnitude of the extremum. Since the slope of the transverse voltage waveform changes sign, either going from positive to negative or going from negative to positive, the slope of the transverse voltage waveform must pass through a value of zero. Therefore, a zero-crossing detector that observes the voltage on the transverse winding may detect magnetic saturation. A controller that opens a switch in a power winding in response to a zero-crossing detector that senses the voltage on a transverse winding may control a power supply to operate at its maximum power capability without damage. In practice, to avoid false indications of magnetic saturation, the zero-crossing detector may be gated to observe the voltage on the transverse winding only after the switch has been closed for a threshold time, or alternatively, only when the current in the switch is greater than a threshold current.

The preceding examples have illustrated the application of a magnetic saturation detector in a power supply with a power converter that operates in discontinuous conduction mode (DCM). That is, in each switching period the current in the power windings and the flux density in the energy transfer element (with no flux density offset) start at a value of zero and end at a value of zero. In contrast, under different conditions of input voltage, output voltage, and load, a power supply may operate its power converter in continuous conduction mode (CCM). That is, in CCM the current in the power windings and the flux density (again with no flux density offset in the energy transfer element) do not start and end at a value of zero in each switching period. The operation of the magnetic saturation detector in CCM is the same as the operation in DCM when in each switching period the flux density starts and ends within the quasi-linear region $B_{QL}$ 335.

Known magnetic saturation detectors compare the magnitude of the transverse voltage with a reference value to provide an indication of magnetic saturation in the energy transfer element. Use of the magnitude of the transverse voltage to detect magnetic saturation is subject to inaccuracy and uncertainties owing to the variation of the flux density with temperature and the relationship of the voltage on the transverse windings to the voltage on the power windings.

The voltage on the power windings establishes the rate of change of the power flux density, and therefore is a multiplier of the voltage that appears on the transverse windings. A magnetic saturation detector that compares the magnitude of the transverse voltage with a reference voltage to indicate magnetic saturation in a power supply must adjust the reference voltage to be proportional to the input voltage of the power supply. The proportionality factor is difficult to calculate and typically must be determined after the energy transfer element is constructed. Moreover, the relationship between the flux density and the current in a power winding has a strong dependence on temperature. Although the salient features of the relationship are preserved over a wide range of temperature, particular characteristics such as the quasi-linear region $B_{QL}$ 335, the upper end of the quasi-linear region 325, and the saturation flux density $B_{SAT}$ 315 vary greatly with temperature in a way that is difficult to characterize. The saturation flux density of magnetic materials used in power converters typically has a strong dependence on temperature, decreasing at higher temperatures.

The magnetic saturation detector described in this disclosure overcomes the limitations of known methods, since detecting the change in the sign of the slope of the transverse voltage, or equivalently, detecting a zero crossing of the slope of the transverse voltage, is a direct indication of saturation at all input voltages and temperatures. Although the magnitude of the transverse voltage may change with input voltage and temperature by unpredictable amounts, the zero crossing of the slope will always be an accurate indication of magnetic saturation.

Figure 6:
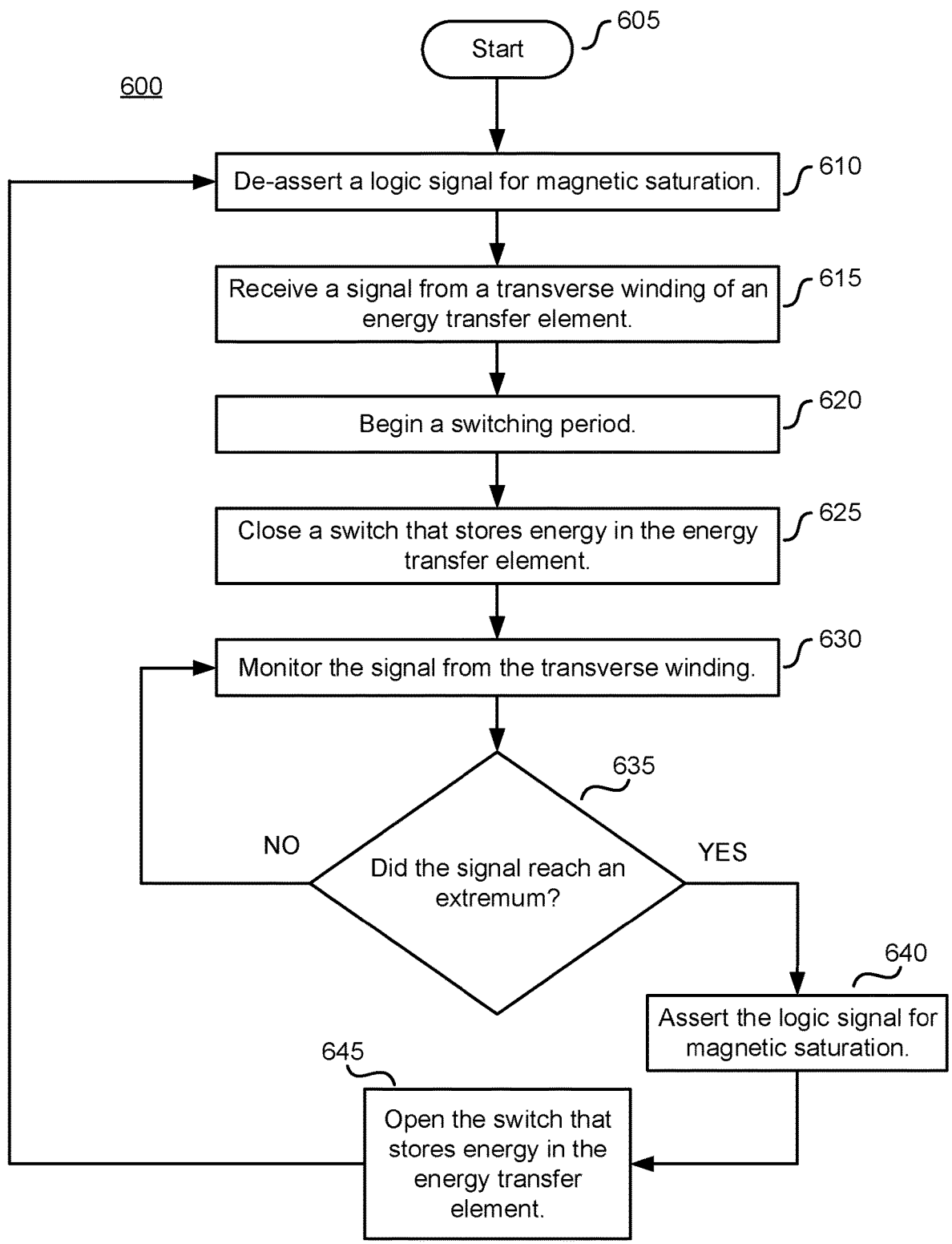
FIG. 6 is a flow diagram that illustrates steps in the operation of an example power converter with a magnetic saturation detector that uses a transverse winding in an energy transfer element, in accordance with embodiments of the present disclosure.

FIG. 6 is a flow diagram 600 that illustrates steps in the operation of an example magnetic saturation detector included in an energy transfer element in a power supply such as for example, in the power supply of FIG. 1A. An electronic circuit in the input-referenced controller 132 may observe the transverse voltage $VT_1$ 130 and respond with a signal that indicates magnetic saturation for the control of switch S1 110.

After starting at step 605, the circuit may de-assert a logic signal that indicates magnetic saturation in step 610. The circuit may receive a signal from a transverse winding of an energy transfer element in step 615. The signal received from the transverse winding is typically a voltage. The controller may begin a switching period in step 620, followed by closing a switch that stores energy in the energy transfer element in step 625. The controller may monitor the signal from the transverse winding in step 630. The signal from the transverse winding may be gated conditionally with time, current, or other operational parameters to prevent false indications of magnetic saturation. The circuit may check the signal from the transverse winding to detect the occurrence of an extremum in its variation in magnitude with time in step 635.

If the circuit does not detect an extremum in step 635, the flow may return to step 630 where the circuit continues to monitor the signal from the transverse winding. If the circuit detects an extremum in step 635, the circuit may assert the logic signal for magnetic saturation in step 640, open the switch that stores energy in the energy transfer element in step 645, followed by a return to step 610 for de-assertion of the logic signal after the switch opens.

The example power supply of FIG. 1A uses two transverse windings to obtain the benefit of galvanic isolation between the circuit that provides the transverse current and the circuit that senses the transverse voltage. It is usually desirable to provide the current from a relatively low voltage as is typically on the output of the power supply in contrast to the relatively high voltage that may be the only source of power available at the input of the power supply. In applications that do not require two transverse windings, the magnetic saturation detector may use a single transverse winding as illustrated in FIG. 7.

Figure 7:
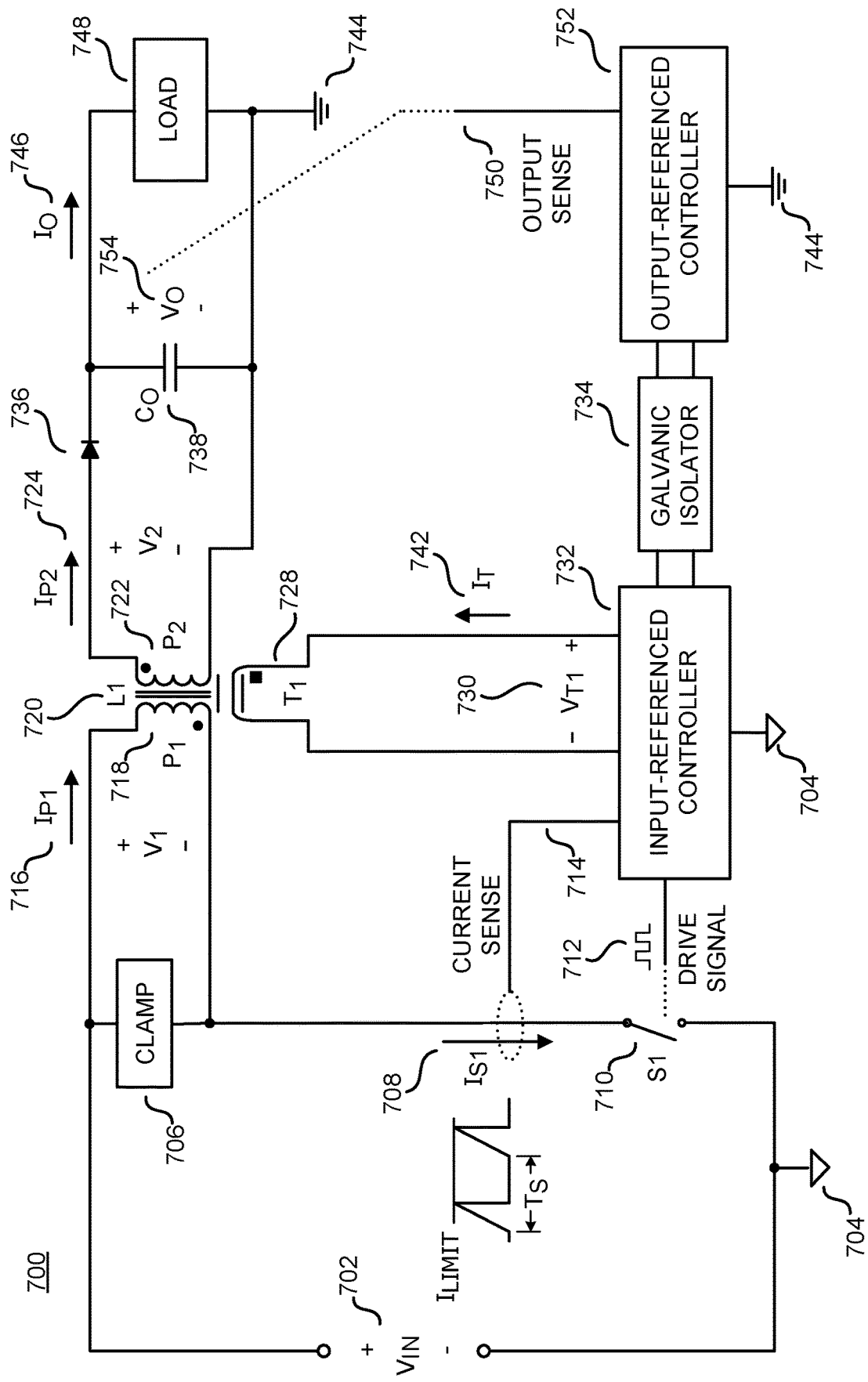
FIG. 7 is schematic diagram illustrating another example power supply that includes a switched mode power converter with a magnetic saturation detector, in accordance with embodiments of the present disclosure.

FIG. 7 is a schematic diagram 700 of an example power supply configured to operate with a magnetic saturation detector that uses only a single transverse winding. The example power supply of FIG. 7 receives an input voltage $V_{IN}$ 702 with respect to an input return 704 and provides a regulated output to a load 748. The regulated output may be a voltage $V_O$ 754 with respect to an output return 744, a current $I_O$ 746, or a combination of both. The example power supply of FIG. 7 is similar to the example power supply of FIG. 1A except that the example power supply of FIG. 7 includes a magnetic saturation detector that has only a single transverse winding.

The example power supply of FIG. 7 uses a flyback power converter to produce an output that is galvanically isolated from the input. In other words, a voltage applied between the input return 704 and the output return 744 would produce negligible current. The flyback power converter in the example power supply of FIG. 7 includes an energy transfer element L1 720 that has an input power winding $P_1$ 718, output power winding $P_2$ 722, and a single transverse winding $T_1$ 728. Power windings $P_1$ 718 and $P_2$ 722 take part principally in the transfer of energy between the input and the output, whereas transverse winding $T_1$ 728 takes part principally in the detection of magnetic saturation. A clamp circuit 706 is coupled across the input power winding $P_1$ 718. An input switch S1 710 is coupled between the input power winding $P_1$ 718 and the input return 704.

In operation, an input-referenced controller 732 receives signals from an output-referenced controller 752 through a galvanic isolator 734 to produce a drive signal 712 that opens and closes the input switch S1 710. An open switch cannot conduct current, whereas a closed switch may conduct current. The input-referenced controller 732 senses current $I_{S1}$ 708 in the input switch S1 710 as a current sense signal 714. In one mode of operation, input-referenced controller 732 may open input switch S1 710 when the current $I_{S1}$ 708 reaches a threshold value. In another mode of operation explained earlier in this disclosure, the input-referenced controller 732 may open input switch S1 710 when energy transfer element L1 720 reaches a state of impending magnetic saturation.

The switching of switch S1 710 produces pulsating currents $I_{P1}$ 716 and $I_{P2}$ 724 in the respective power windings $P_1$ 718 and $P_2$ 722 of energy transfer element L1 720, as well as pulsating voltages $V_1$ and $V_2$ across those respective windings. Clamp circuit 706 prevents excess voltage on input power switch S1 710 when the switch opens. Output winding current $I_{P2}$ 724 from output power winding $P_2$ 722 is rectified by diode 736 and filtered by output capacitor $C_O$ 738 to produce an output voltage $V_O$ 754 and an output current $I_O$ 746 at a load 748. Either the output voltage $V_O$ 754, the output current $I_O$ 746, or a combination of both may be sensed as an output sense signal 750 by the output-referenced controller 752. The output-referenced controller compares the sensed output quantity to a reference value, and communicates with the input-referenced controller 732 through a galvanic isolator circuit 734 to switch the input switch S1 710 appropriately to obtain the desired output values. The galvanic isolator circuit 734 may include any of the many known ways use to use optical, magnetic, and capacitive technologies to couple signals between galvanically isolated circuits.

In the example power supply of FIG. 7, transverse winding $T_1$ 728 receives a transverse current $I_T$ 742 from input-referenced controller 732. Transverse current $I_T$ 742 is typically a constant current that provides a transverse magnetic flux density within energy transfer element L1 720, producing transverse voltage $V_{T1}$ 730 on transverse winding $T_1$ 728 to indicate magnetic saturation.

Figure 8:
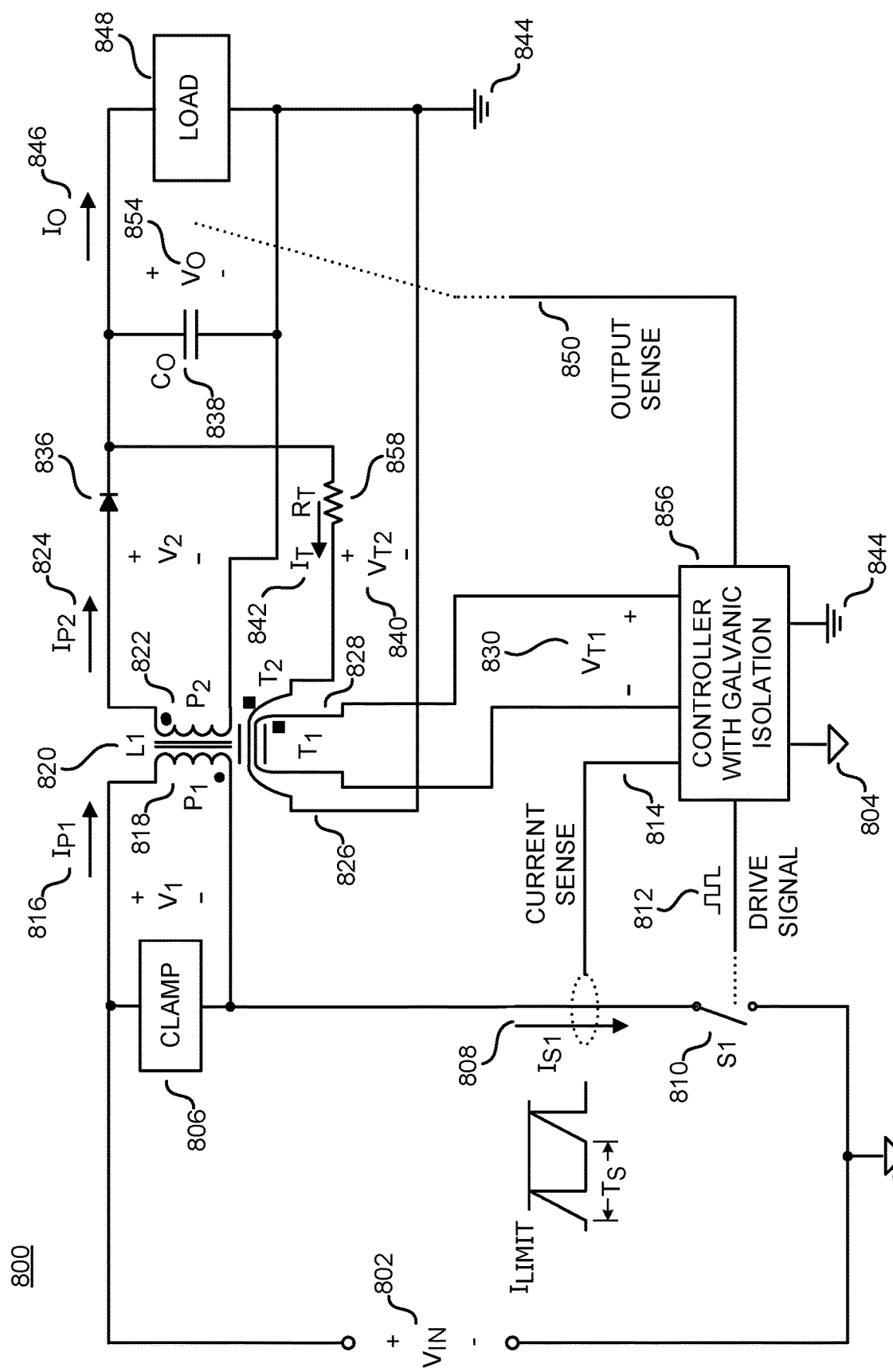
FIG. 8 is a schematic diagram illustrating yet another example power supply that includes a switched mode power converter with a magnetic saturation detector, in accordance with embodiments of the present disclosure.

In some applications of the magnetic saturation detector it may be desirable to provide current to a transverse winding directly from a relatively low voltage circuit without the complexity of a circuit included in an integrated controller. FIG. 8 is a schematic diagram 800 of yet another example power supply that includes a switched mode power converter configured to operate with a magnetic saturation detector, the example of FIG. 8 using only a resistor on the output of the power supply to provide current to a transverse winding.

The example power supply of FIG. 8 receives an input voltage $V_{IN}$ 802 with respect to an input return 804 and provides a regulated output to a load 848. The regulated output may be a voltage $V_O$ 854 with respect to an output return 844, a current $I_O$ 846, or a combination of both.

The example power supply of FIG. 8 uses a flyback power converter to produce an output that is galvanically isolated from the input. In other words, a voltage applied between the input return 804 and the output return 844 would produce negligible current. The flyback power converter in the example power supply of FIG. 8 includes an energy transfer element L1 820 that has an input power winding $P_1$ 818, output power winding $P_2$ 822, a first transverse winding $T_1$ 828 and a second transverse winding $T_2$ 826. Power windings $P_1$ 818 and $P_2$ 822 take part principally in the transfer of energy between the input and the output, whereas transverse windings $T_1$ 828 and $T_2$ 826 take part principally in the detection of magnetic saturation. A clamp circuit 806 is coupled across the input power winding $P_1$ 818. An input switch S1 810 is coupled between the input power winding $P_1$ 818 and the input return 804.

In operation, a controller 856 with galvanic isolation receives an output-referenced output sense signal 850 and an input-referenced current sense signal 814 to produce a drive signal 812 that opens and closes the input switch S1 810. An open switch cannot conduct current, whereas a closed switch may conduct current. The controller 856 senses current $I_{S1}$ 808 in the input switch S1 810 as a current sense signal 814. In one mode of operation, controller 856 may open input switch S1 810 when the current $I_{S1}$ 808 reaches a threshold value. In another mode of operation explained earlier in this disclosure, the controller 856 may open input switch S1 810 when energy transfer element L1 820 reaches a state of impending magnetic saturation.

The switching of switch S1 810 produces pulsating currents $I_{P1}$ 816 and $I_{P2}$ 824 in the respective power windings $P_1$ 818 and $P_2$ 822 of energy transfer element L1 820, as well as pulsating voltages $V_1$ and $V_2$ across those respective windings. Clamp circuit 806 prevents excess voltage on input power switch S1 810 when the switch opens. Output winding current $I_{P2}$ 824 from output power winding $P_2$ 822 is rectified by diode 836 and filtered by output capacitor $C_O$ 838 to produce an output voltage $V_O$ 854 and an output current $I_O$ 846 at a load 848. Either the output voltage $V_O$ 854, the output current $I_O$ 846, or a combination of both may be sensed as an output sense signal 850 by the controller 856. An output-referenced part of controller 856 may compare the sensed output quantity to a reference value, and communicate with an input-referenced part of controller 856 through an internal galvanic isolator circuit to switch the input switch S1 810 appropriately to obtain the desired output values. The galvanic isolator circuit internal to controller 856 may include any of the many known ways use to use optical, magnetic, and capacitive technologies to couple signals between galvanically isolated circuits.

In the example power supply of FIG. 8, transverse winding $T_2$ 826 receives a transverse current $I_T$ 842 from output voltage $V_O$ 854 through resistor $R_T$ 858. Transverse current $I_T$ 842 is typically a relatively constant current that provides a transverse magnetic flux density within energy transfer element L1 820, producing transverse voltages $V_{T1}$ 830 and $V_{T2}$ 840 on respective transverse windings $T_1$ 828 and $T_2$ 826 to indicate magnetic saturation. Transverse voltage $V_{T2}$ 840 is typically much lower than output voltage $V_O$ 854 so that the transverse voltage $V_{T2}$ 840 has negligible effect on the transverse current $I_T$ 842 when output voltage $V_O$ is near its regulated value.

The magnetic cores in FIG. 2A and FIG. 2B were presented as a generic example to show the salient features of the construction of an energy transfer element that includes transverse windings for a magnetic saturation detector. FIG. 9A is a perspective view 900A of an example energy transfer element using a modified standard magnetic core configuration to include transverse windings that may be used in a magnetic saturation detector. FIG. 9B is a perspective view 900B of an example energy transfer element using a standard magnetic core configuration that requires no modification to include transverse windings that may be used in a magnetic saturation detector.

The example energy transfer element in FIG. 9A is constructed from two standard EE-style ferrite core-halves, an upper core-half 905A and a lower core-half 915A. An example power winding 918A is shown encircling a center post. A hole 935A must be drilled in the center post of each standard core-half to make the aperture for transverse windings 926A and 928A.

The example energy transfer element in FIG. 9B is constructed from two standard RM-style ferrite core-halves, an upper core-half 905B and a lower core-half 915B. An example power winding 918B is shown encircling a center post. A hole 935B in the center of the center post of each core-half is an off-the-self option that accommodates a ferrite slug to adjust the inductance of the power winding after assembly. Transverse windings 926B and 928B may traverse the adjustment hole in place of the ferrite slug to provide for a magnetic saturation detector in accordance with the teaching of this invention.

Embodiments of the present disclosure include a saturation detector in which a magnetic energy transfer element includes at least one transverse winding and at least one power winding. One transverse winding conducts a current to establish a transverse flux density in the magnetic energy transfer element. Current in a power winding produces a principal flux density that is substantially perpendicular to the transverse flux density. A saturation detector circuit senses a voltage on a transverse winding, and indicates a condition of magnetic saturation at an extremum of the time-varying voltage on the transverse winding.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1

A magnetic saturation detector comprising: an energy transfer element having a center post; an input power winding wrapped around the center post; and a first transverse winding perpendicular to the input power winding and coupled to receive a transverse current that provides a transverse magnetic flux density within the energy transfer element, wherein the transverse magnetic flux density produces a transverse voltage waveform; and a voltage detection circuit configured to receive the transverse voltage waveform and detect a change in the sign of the slope of the transverse voltage waveform, wherein the change in the sign of the slope indicates magnetic saturation.

Example 2

The magnetic saturation detector of example 1, wherein the voltage detection circuit is further configured to detect an occurrence of an extremum in the transverse voltage waveform.

Example 3

The magnetic saturation detector of example 1, further comprising a second transverse winding, perpendicular to the input power winding and configured to sense the transverse magnetic flux density and produce the transverse voltage waveform.

Example 4

A controller configured to detect magnetic saturation, the controller comprising: a magnetic saturation detector comprising, an energy transfer element having a center post, an input power winding wrapped around the center post, a first transverse winding perpendicular to the input power winding and coupled to receive a transverse current that provides a transverse magnetic flux density within the energy transfer element, wherein the transverse magnetic flux density produces a transverse voltage waveform, and a voltage detection circuit configured to receive the transverse voltage waveform and detect a change in the sign of the slope of the transverse voltage waveform, wherein the change in the sign of the slope indicates magnetic saturation; and a regulator, coupled to the first transverse winding and configured to compare an output sense signal to a reference value and generate a switching signal and the transverse current.

Example 5

The controller of example 4, wherein the voltage detection circuit is configured to detect an occurrence of an extremum in the transverse voltage waveform.

Example 6

The controller of example 5, wherein the magnetic saturation detector is further configured to generate the output sense signal, and the regulator comprises: an input-referenced controller, coupled to the transverse winding; and an output-referenced controller, coupled to the transverse winding, wherein one of the input-referenced controller and the output-referenced controller is configured to generate the transverse current.

Example 7

The controller of example 6, the regulator further comprising a galvanic isolator, coupled to receive the switching signal from the output-referenced controller and transmit the switching signal to the input-referenced controller.

Example 8

The controller of example 7, further comprising a second transverse winding, perpendicular to the input power winding and configured to sense the transverse magnetic flux density and produce the transverse voltage waveform.

Example 9

The controller of example 8, wherein the output-referenced controller is configured to generate the transverse current in the second transverse winding and the input-referenced controller is configured to monitor the transverse voltage.

Example 10

The controller of example 4, the magnetic saturation detector further comprising an output power winding perpendicular to the second transverse winding, wherein the output-referenced controller is coupled to the second transverse winding and configured to generate the transverse current.

Example 11

The controller of example 10, wherein the energy transfer element is included in a power converter.

Example 12

The controller of example 11, wherein the power converter is a flyback converter.

Example 13

A method for detecting magnetic saturation, the method comprising: monitoring a transverse voltage waveform from a transverse winding coupled to an energy transfer element; closing a switch that stores energy in the energy transfer element; detecting a change of sign in the slope of the transverse voltage waveform from the transverse winding, the change of sign indicative of magnetic saturation; and opening the switch in response to the change of sign of the slope of the transverse voltage waveform from the transverse winding.

Example 14

The method of example 13, wherein detecting a change of sign in the slope comprises detecting an occurrence of an extremum in the transverse voltage waveform.

Example 15

The method of example 13, further comprising gating the transverse voltage waveform from the transverse winding according to an operational parameter, the parameter chosen to prevent false indications of magnetic saturation.

Example 16

The method of example 15, wherein the operational parameter is selected from a group that comprises time and current.

Example 17

The method of example 15, wherein gating the transverse voltage waveform comprises comparing an output sense signal to a reference value, and generating a switching signal based on the comparison.

Example 18

The method as example 17, further comprising receiving a transverse current.

Example 19

The method of example 18, wherein the transverse current is provided by an input-referenced controller coupled to the transverse windings.

Example 20

The method of example 18, wherein the transverse current is provided by an output-referenced controller coupled to the transverse winding.

What is claimed is:

1. A magnetic saturation detector comprising:
   an energy transfer element having a center post;
   an input power winding wrapped around the center post; and
   a first transverse winding perpendicular to the input power winding and coupled to receive a transverse current that provides a transverse magnetic flux density within the energy transfer element, wherein the transverse magnetic flux density produces a transverse voltage waveform; and
   a voltage detection circuit configured to receive the transverse voltage waveform and detect a change in the sign of the slope of the transverse voltage waveform, wherein the change in the sign of the slope indicates magnetic saturation.

2. The magnetic saturation detector of claim 1, wherein the voltage detection circuit is further configured to detect an occurrence of an extremum in the transverse voltage waveform.

3. The magnetic saturation detector of claim 1, further comprising a second transverse winding, perpendicular to the input power winding and configured to sense the transverse magnetic flux density and produce the transverse voltage waveform.

4. A controller configured to detect magnetic saturation, the controller comprising:
   a magnetic saturation detector comprising,
   an energy transfer element having a center post,
   an input power winding wrapped around the center post,
   a first transverse winding perpendicular to the input power winding and coupled to receive a transverse current that provides a transverse magnetic flux density within the energy transfer element,
   wherein the transverse magnetic flux density produces a transverse voltage waveform, and
   a voltage detection circuit configured to receive the transverse voltage waveform and detect a change in the sign of the slope of the transverse voltage waveform,
   wherein the change in the sign of the slope indicates magnetic saturation; and
   a regulator, coupled to the first transverse winding and configured to compare an output sense signal to a reference value and generate a switching signal and the transverse current.

5. The controller of claim 4, wherein the voltage detection circuit is configured to detect an occurrence of an extremum in the transverse voltage waveform.

6. The controller of claim 5, wherein the magnetic saturation detector is further configured to generate the output sense signal, and the regulator comprises:
   an input-referenced controller, coupled to the transverse winding; and
   an output-referenced controller, coupled to the transverse winding,
   wherein one of the input-referenced controller and the output-referenced controller is configured to generate the transverse current.

7. The controller of claim 6, the regulator further comprising a galvanic isolator, coupled to receive the switching signal from the output-referenced controller and transmit the switching signal to the input-referenced controller.

8. The controller of claim 7, further comprising a second transverse winding, perpendicular to the input power winding and configured to sense the transverse magnetic flux density and produce the transverse voltage waveform.

9. The controller of claim 8, wherein the output-referenced controller is configured to generate the transverse current in the second transverse winding and the input-referenced controller is configured to monitor the transverse voltage.

10. The controller of claim 4, the magnetic saturation detector further comprising an output power winding perpendicular to the second transverse winding, wherein the output-referenced controller is coupled to the second transverse winding and configured to generate the transverse current.

11. The controller of claim 10, wherein the energy transfer element is included in a power converter.

12. The controller of claim 11, wherein the power converter is a flyback converter.

13. A method for detecting magnetic saturation, the method comprising:
   monitoring a transverse voltage waveform from a transverse winding coupled to an energy transfer element;
   closing a switch that stores energy in the energy transfer element;
   using a voltage detection circuit to receive the transverse voltage waveform and to detect a change of sign in the slope of the transverse voltage waveform, the change of sign in the slope indicative of magnetic saturation; and
   opening the switch in response to the change of sign in the slope of the transverse voltage waveform from the transverse winding.

14. The method of claim 13, wherein using a voltage detection circuit to receive the transverse voltage waveform and to detect the change of sign in the slope comprises detecting an occurrence of an extremum in the transverse voltage waveform.

15. The method of claim 13, further comprising gating the transverse voltage waveform from the transverse winding according to an operational parameter, the parameter chosen to prevent false indications of magnetic saturation.

16. The method of claim 15, wherein the operational parameter is selected from a group that comprises time and current.

17. The method of claim 15, wherein gating the transverse voltage waveform comprises comparing an output sense signal to a reference value, and generating a switching signal based on the comparison.

18. The method of claim 17, further comprising receiving a transverse current.

19. The method of claim 18, wherein the transverse current is provided by an input-referenced controller coupled to the transverse windings.

20. The method of claim 18, wherein the transverse current is provided by an output-referenced controller coupled to the transverse winding.

* * * * *